US010170273B2

United States Patent
Ichimura et al.

(10) Patent No.: US 10,170,273 B2
(45) Date of Patent: Jan. 1, 2019

(54) CHARGED PARTICLE BEAM DEVICE, AND METHOD OF MANUFACTURING COMPONENT FOR CHARGED PARTICLE BEAM DEVICE

(71) Applicant: Hitachi High-Technologies Corporation, Minato-ku, Tokyo (JP)

(72) Inventors: Takashi Ichimura, Tokyo (JP); Hiroyuki Ito, Tokyo (JP); Shinichi Kato, Tokyo (JP); Hisaya Murakoshi, Tokyo (JP); Tadashi Fujieda, Tokyo (JP); Tatsuya Miyake, Tokyo (JP); Takashi Naitou, Tokyo (JP); Takuya Aoyagi, Tokyo (JP); Kenji Tanimoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/544,958

(22) PCT Filed: Jan. 21, 2016

(86) PCT No.: PCT/JP2016/051631
§ 371 (c)(1),
(2) Date: Jul. 20, 2017

(87) PCT Pub. No.: WO2016/117628
PCT Pub. Date: Jul. 28, 2016

(65) Prior Publication Data
US 2018/0019096 A1 Jan. 18, 2018

(30) Foreign Application Priority Data

Jan. 23, 2015 (WO) .................. PCT/JP2015/051750

(51) Int. Cl.
*H01J 37/16* (2006.01)
*H01J 9/18* (2006.01)
(Continued)

(52) U.S. Cl.
CPC ................ *H01J 37/16* (2013.01); *C23D 5/02* (2013.01); *H01J 9/18* (2013.01); *H01J 37/065* (2013.01);
(Continued)

(58) Field of Classification Search
CPC .......... H01J 37/00; H01J 37/02; H01J 37/023; H01J 37/04; H01J 37/05; H01J 37/063;
(Continued)

(56) References Cited

U.S. PATENT DOCUMENTS 4,498,952 A * 2/1985 Christensen .......... H01J 1/3042
216/11
4,847,947 A * 7/1989 Tsong-Chi ............ E05D 7/0407
16/235
(Continued)

FOREIGN PATENT DOCUMENTS

JP 63-54241 U 4/1988
JP 4-115749 U 10/1992
(Continued)

OTHER PUBLICATIONS

Japanese-language Office Action issued in counterpart Japanese Application No. 2016-570691 dated May 8, 2018 (five (5) pages).
(Continued)

*Primary Examiner* — Jason McCormack
(74) *Attorney, Agent, or Firm* — Crowell & Moring LLP

(57) ABSTRACT

The purpose of the present invention is to provide a charged particle beam device that exhibits high performance due to the use of vanadium glass coatings, and to provide a method of manufacturing a component for a charged particle beam
(Continued)

device. Specifically provided is a charged particle beam device using a vacuum component characterized by comprising a metal container, the interior space of which is evacuated to form a high vacuum, and coating layers formed on the surface on the interior space-side of the metal container, wherein the coating layers are vanadium-containing glass, which is to say an amorphous substance. Coating vanadium glass onto walls of a space where it is desirable to form a high vacuum, for example walls in the vicinity of an electron source, reduces gas discharge in the vicinity of the electron source, and the getter effect of the coating layer induces localized evacuation and enables the formation of an extremely high vacuum, even in spaces having a complex structure, without providing a large high-vacuum pump.

17 Claims, 12 Drawing Sheets

(51) Int. Cl.
    *H01J 37/065* (2006.01)
    *H01J 37/147* (2006.01)
    *C23D 5/02* (2006.01)
    *H01J 37/12* (2006.01)
    *H01J 37/317* (2006.01)

(52) U.S. Cl.
    CPC ............ *H01J 37/12* (2013.01); *H01J 37/147* (2013.01); *H01J 37/3178* (2013.01)

(58) Field of Classification Search
    CPC ........ H01J 37/065; H01J 37/067; H01J 37/10; H01J 37/12; H01J 37/14; H01J 37/141; H01J 37/1413; H01J 37/145; H01J 37/16
    USPC .............. 250/396 R, 396 ML, 306, 307, 311
    See application file for complete search history.

(56) References Cited

U.S. PATENT DOCUMENTS

| | | | |
|---|---|---|---|
| 5,548,183 A * | 8/1996 | Miyoshi | H01J 37/065 313/153 |
| 7,193,221 B2 | 3/2007 | Okumura et al. | |
| 8,803,411 B2 | 8/2014 | Watanabe et al. | |
| 2006/0231773 A1 | 10/2006 | Katagiri et al. | |
| 2008/0048552 A1* | 2/2008 | Ito | H01J 9/261 313/496 |
| 2009/0001537 A1* | 1/2009 | Summers | B81C 1/00285 257/682 |
| 2012/0085925 A1* | 4/2012 | Kasuya | B82Y 10/00 250/453.11 |
| 2012/0223245 A1* | 9/2012 | Bennett | B82Y 30/00 250/396 R |
| 2013/0140977 A1 | 6/2013 | Watanabe et al. | |
| 2014/0252325 A1* | 9/2014 | Kim | H01L 51/5259 257/40 |

FOREIGN PATENT DOCUMENTS

| | | |
|---|---|---|
| JP | 2000-268755 A | 9/2000 |
| JP | 2001-223154 A | 8/2001 |
| JP | 2001-266739 A | 9/2001 |
| JP | 2006-294481 A | 10/2006 |
| JP | 2007-184146 A | 7/2007 |
| JP | 2008-16251 A | 1/2008 |
| JP | 2008-53026 A | 3/2008 |
| JP | 4083768 B2 | 4/2008 |
| JP | 2008-214153 A | 9/2008 |
| JP | 2012-33298 A | 2/2012 |
| JP | 5023199 B2 | 9/2012 |
| JP | 2013-149751 A | 8/2013 |
| JP | 2014-49683 A | 3/2014 |
| WO | WO 03/107383 A1 | 12/2003 |

OTHER PUBLICATIONS

International Search Report (PCT/ISA/210) issued in PCT Application No. PCT/JP2015/051750 dated Mar. 31, 2015 with English translation (6 pages).
Japanese-language Written Opinion (PCT/ISA/237) issued in PCT Application No. PCT/JP2015/051750 dated Mar. 31, 2015 (4 pages).
International Search Report (PCT/ISA/210) issued in PCT Application No. PCT/JP2016/051631 dated May 17, 2016 with English translation (6 pages).
Japanese-language Written Opinion (PCT/ISA/237) issued in PCT Application No. PCT/JP2016/051631 dated May 17, 2016 (6 pages).

* cited by examiner

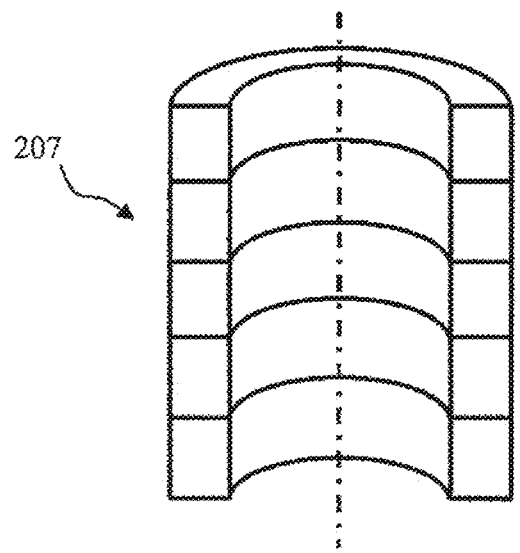
FIG. 3A
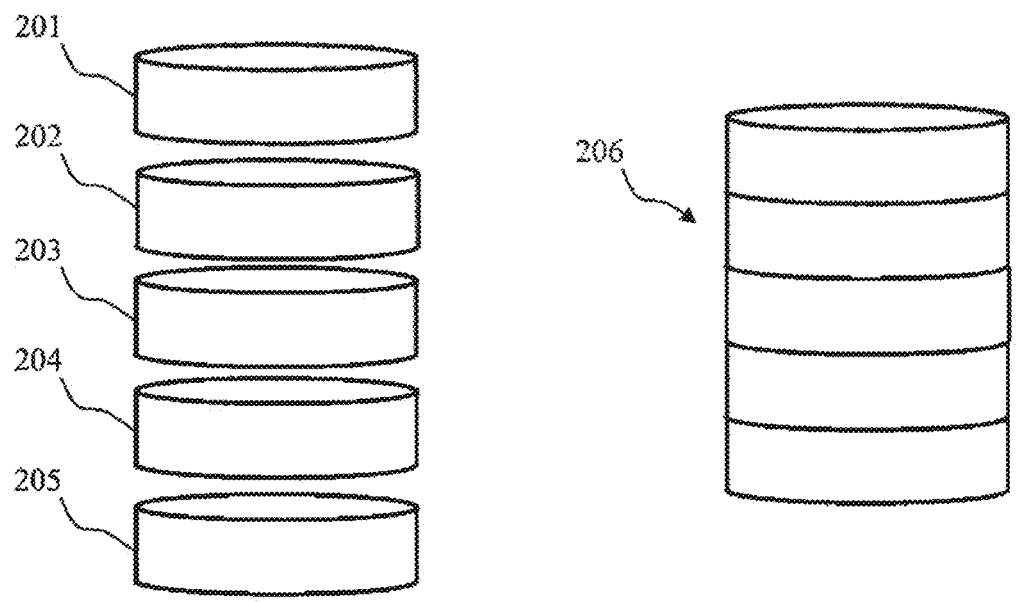
FIG. 3B
FIG. 3C

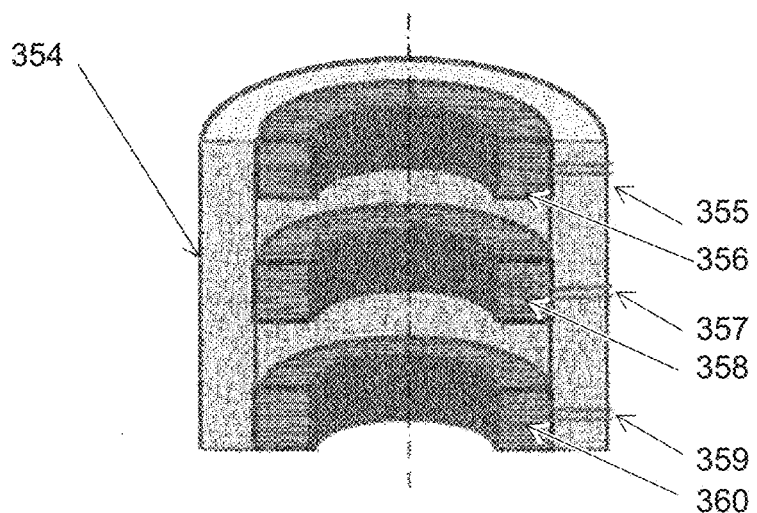
FIG. 4A
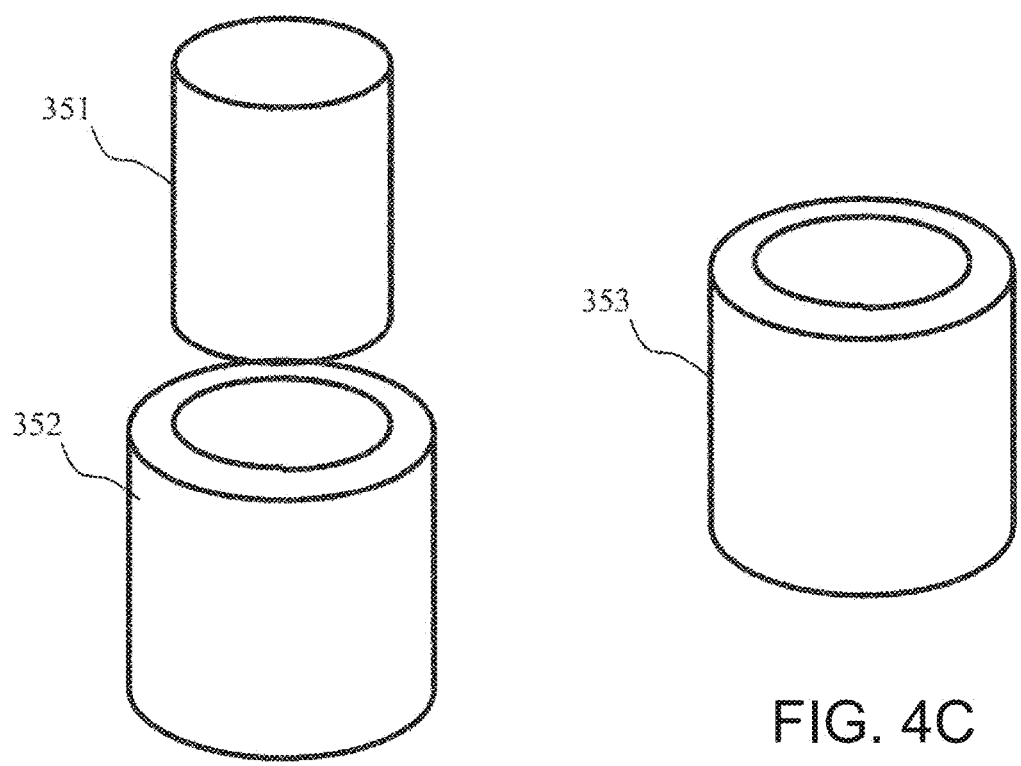
FIG. 4B
FIG. 4C

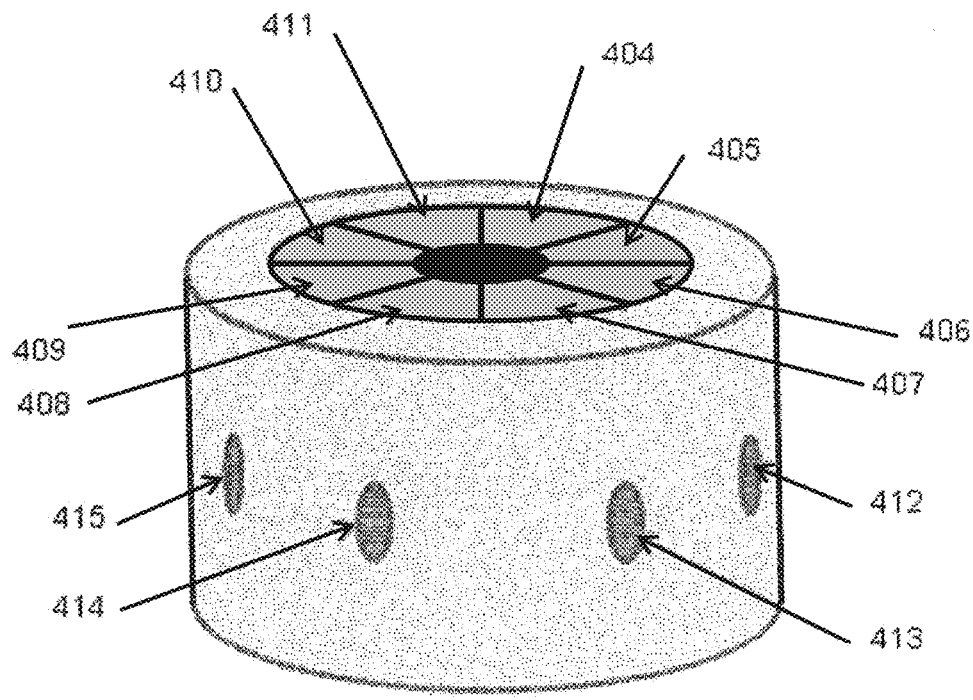
FIG. 5A
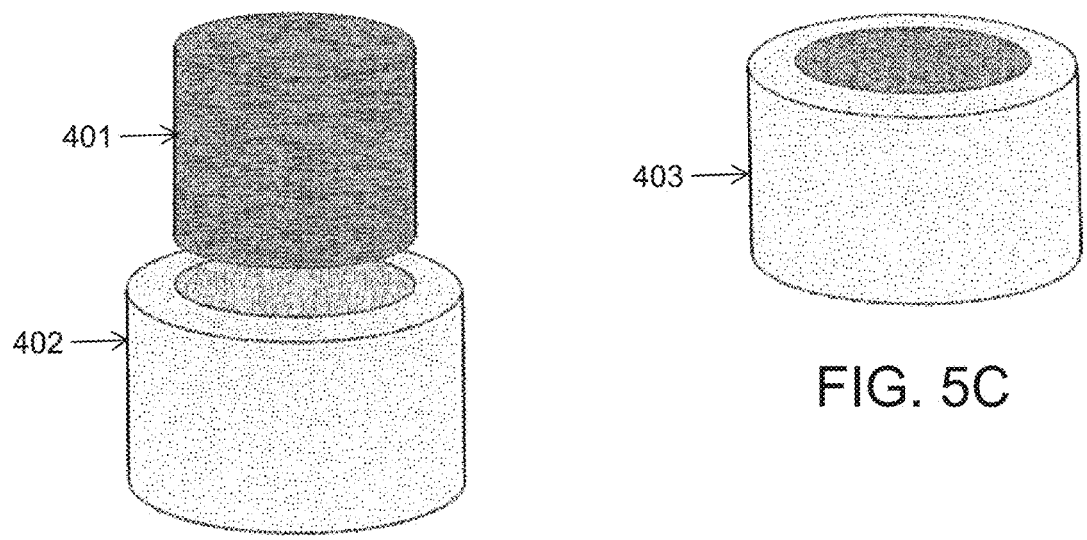
FIG. 5B
FIG. 5C

CHARGED PARTICLE BEAM DEVICE, AND METHOD OF MANUFACTURING COMPONENT FOR CHARGED PARTICLE BEAM DEVICE

TECHNICAL FIELD

The present invention relates to a charged particle beam device, and particularly relates to a charged particle beam device including a voltage applied member to which voltage that deflects, focuses, extracts a charged particle beam from a charged particle source and the like or accelerates the charged particle beam is applied, and a method of manufacturing the charged particle beam device.

BACKGROUND ART

A charged particle beam device represented by an electron microscope is a device that accelerates a charged particle beam emitted from a charged particle source and that irradiates a sample with the accelerated beam. A scanning electron microscope is provided with, for example, an extraction electrode for extracting a beam from an electron source, an accelerating electrode for accelerating the beam extracted from the extraction electrode, a scanning deflector for scanning the beam on the sample, an aberration corrector for correcting an aberration, an electrostatic lens, and a corrector for adjusting an orbit of the beam so as to pass an ideal optical axis of these optical devices.

These optical devices are for controlling the beam by an electric field generated by applying different voltages to plural different electrodes, and such plural electrodes forming the electric field need to be properly insulated so as not to be conducted.

In Patent Literature 1, an electron gun using a conductive insulator for an accelerating tube is disclosed. When the conductive insulator is used for the accelerating tube, charges generated by collision of an electron beam on a surface of the insulator flows on the surface of the conductive insulator as electric current, therefore, charge-up can be suppressed. In Patent Literature 2, an electronic optical lens barrel formed of conductive, though high-resistance, ceramics is disclosed. As a tube body of the lens barrel, especially an inner tube is made to be highly resistant and conductive, a charge-up amount between electrodes can be reduced. In Patent Literature 3, a method of suppressing charge-up of an electrostatic deflector in an electron beam exposure device by covering an electrode surface with vanadium dioxide (VO2) is explained. Furthermore, in Patent Literature 4, an electrostatic deflector interposing an insulating member such as a glass substrate between electrodes is explained. In Patent Literature 5, an electrostatic deflector in a charged particle beam exposure device is formed of a composite material including non-magnetic oxide particles such as CaVO3 and inorganic glass is explained.

CITATION LIST

Patent Literature

Patent Literature 1: Japanese Patent No. 5023199 (corresponding U.S. Pat. No. 8,803,411)
Patent Literature 2: WO2003/107383 (corresponding U.S. Pat. No. 7,193,221)
Patent Literature 3: Japanese Patent No. 4083768
Patent Literature 4: JP Patent Publication (Kokai) 2000-268755
Patent Literature 5: JP Patent Publication (Kokai) 2001-223154

SUMMARY OF INVENTION

Technical Problem

It is necessary that a high vacuum is kept in an inside of a charged particle beam device through which a charged particle beam, secondary electrons (SE) and backscattered electrons (BSE) that are emitted from a sample pass. The high vacuum needs to be kept particularly in the vicinity of a charged particle source (electron source and the like). In order to create a high vacuum state, it is normally necessary to perform vacuum evacuation using a vacuum pump provided at outside of the charged particle beam device. However, a structure of the inside of the charged particle beam device in which plural optical devices are arranged is complicated and it is difficult to set evacuation conductance to be high. Therefore, there is a limit in creation of the high vacuum state using the vacuum pump installed in the outside.

According to the methods disclosed in Patent Literatures 1 to 3, it is possible to suppress charge-up that can occur in the inside of the charged particle beam device, however, these methods do not contribute to improvement of a degree of vacuum. Furthermore, the insulating member such as the glass substrate and the composite material including the non-magnetic oxide particles and inorganic glass disclosed in Patent Literatures 4 and 5 also do not contribute to improvement of the degree of vacuum.

Hereinafter, a charged particle beam device and a method of manufacturing a member for the charged particle beam device will be proposed, an object of which is to improve a degree of vacuum in the inside.

Solution to Problem

As one aspect for achieving the above object, a charged particle beam device including an optical device that adjusts a charged particle beam emitted from a charged particle source and a vacuum container for forming a vacuum atmosphere in a path where the charged particle beam passes is proposed, in which at least one of an inner wall in the vacuum container and a member arranged inside the vacuum container is formed of vanadium-containing glass.

As another aspect for achieving the above object, a charged particle beam device including an optical devices that adjusts a charged particle beam emitted from a charged particle source and a vacuum container for forming a vacuum atmosphere in a path where the charged particle beam passes is proposed, in which a member positioned inside the vacuum container is coated with a glass layer containing vanadium.

As further another aspect for achieving the above object, a method of manufacturing a member for a charged particle beam device including the step of coating a glass layer containing vanadium on a surface of a member for the charged particle beam device, which is a member placed on a vacuum space side of the charged particle beam device is proposed.

Advantageous Effects of Invention

The vanadium-containing glass can realize a high vacuum inside a vacuum chamber as vacuum evacuation due to the getter effect is possible. In particular, when an optical device and so on of the charged particle beam device are coated with vanadium-containing glass, the high vacuum can be realized even in a portion with a low evacuation conductance by an external vacuum pump.

BRIEF DESCRIPTION OF DRAWINGS

FIGS. 3A-3C are diagrams showing an example in which vanadium glass is applied to a connecting member for electrodes of an accelerating tube that accelerates an electron beam.

FIGS. 4A-4C are diagrams showing an example in which vanadium glass is applied to electrodes of an electrostatic lens for focusing an electron beam and a connecting member (support member) of the electrodes.

FIGS. 5A-5C are diagrams showing an example in which vanadium glass is applied to a component of an aberration corrector that corrects an aberration of an electron beam.

DESCRIPTION OF EMBODIMENTS

Figure 1:
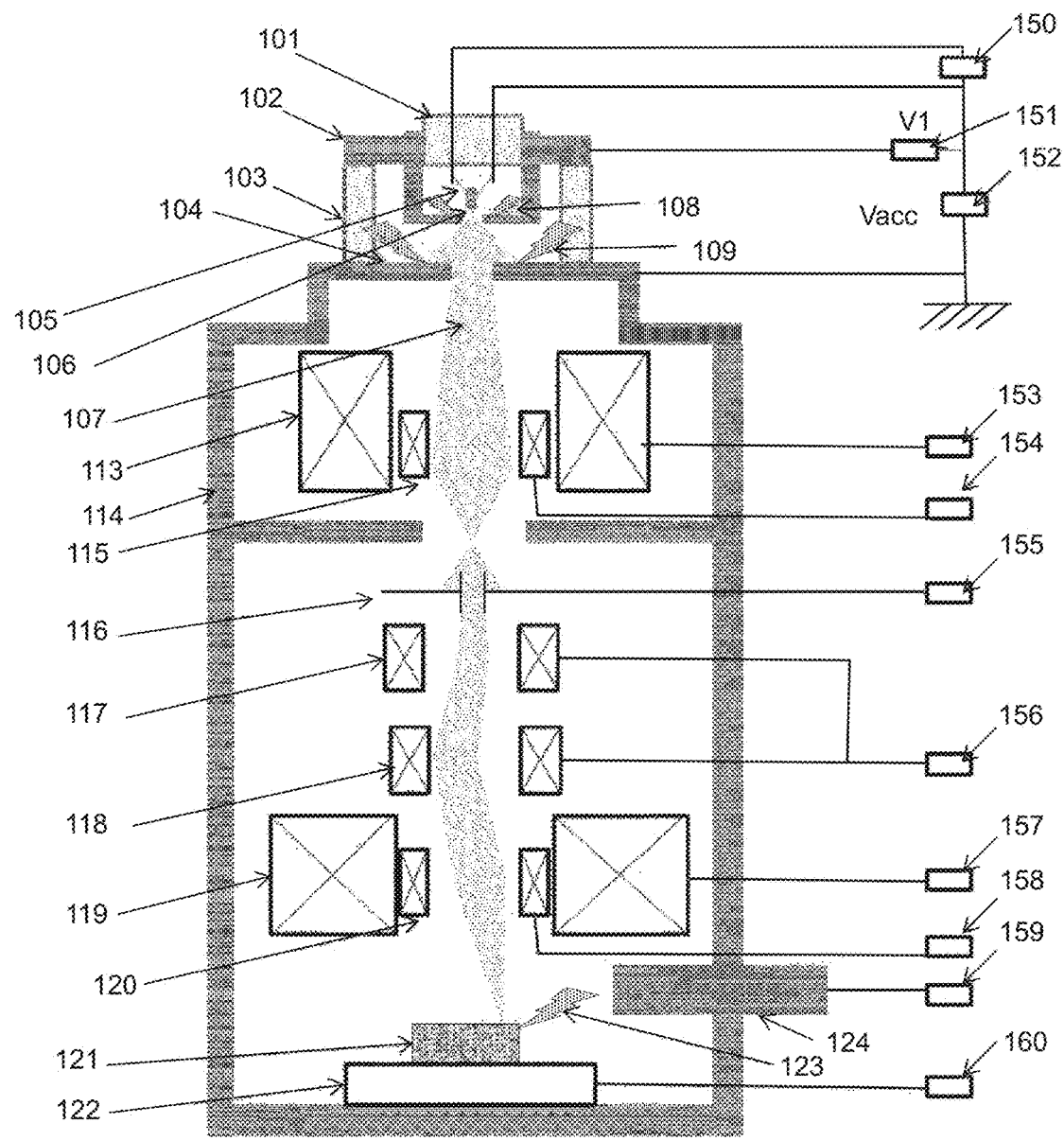
FIG. 1 is a diagram showing an outline of a charged particle beam device.

Optical devices arranged inside an electron microscope and the like need to be accurately formed at proper positions. For example, electrodes forming an electrostatic lens are provided with openings for allowing an electron beam to pass, and the openings need to be formed axially symmetric with respect to an ideal optical axis of the electron beam. It is also necessary that a distance between electrodes is accurately positioned at a proper position as being designed. Electrodes for forming the lens are installed at a device such as the electron microscope through an insulating member such as an insulator. The insulator is formed of a ceramic and so on having high insulation properties, which is an extremely hard member, therefore, it is relatively difficult to perform processing as compared with soft members. It is also difficult to position the optical devices at prescribed positions with high accuracy due to the difficulty in processing.

More specifically, many insulators are formed of ceramics as compositions, which are hard-to-process materials in which a dimensional change of approximately several hundred μm occurs at the time of sintering. When an insulator is bonded to a metal, it is necessary to connect them through members with close thermal expansion coefficients both in the insulator and the metal for securing stable positional accuracy regardless of temperature, which complicates a structure. When respective members are bonded by brazing, bonding surface roughness or the like due to high-temperature heating or the like occurs on an end surface of a brazing material, which may cause unnecessary electric discharge or generation of an impure gas. To form the insulator and the deflector by a conductive ceramic, or to form a conductive film on the ceramic are explained in Patent Literatures 1 to 3, however, it is difficult to form the insulator itself with high accuracy due to the above circumstances, therefore, adoption of a member which can be formed with higher accuracy is desirable.

Hereinafter, a charged particle beam device and a method of manufacturing a member for the charged particle beam device will be proposed, an object of which is to realize high performance in the charge particle beam device based on formation with high accuracy.

As an aspect for achieving the above object, a charged particle beam device including an optical device that changes a charged particle beam emitted from a charged particle source and a vacuum container containing the optical device is proposed, in which the optical device includes an electrode or a voltage applied member formed of a first vanadium-containing glass, and at least one of a support member that supports the voltage applied member and the vacuum container is formed of a second vanadium-containing glass. That is, a charged particle beam device in which a member forming an inner wall of a vacuum container which is positioned in a vacuum space and contacts the vacuum space, a member forming the optical device and members arranged in the vacuum are formed of vanadium-containing glass.

As another aspect for achieving the above object, a method of manufacturing an optical device and a vacuum container mounted on a charged particle beam device or the charged particle beam device is proposed, in which at least one of a connecting member for a voltage applied member included in the optical device that changes a charged particle beam and the vacuum container is formed of vanadium-containing glass.

According to the above structure and the method, it is possible to improve performance of the charged particle beam device based on formation of the charged particle beam device and members for forming the charged particle beam device with high accuracy.

In a structure of electrodes for an electrostatic deflector, an electrostatic lens and so on used for electron beam devices such as an electron microscope, a structure is adopted in which an insulator is interposed between electrodes for electrically separating metal electrodes. As it is difficult to directly bond the insulator to the metal electrode, a method of fastening the insulator by screws, a method of welding the insulator to the metal electrode through brazing parts and so on are used. Moreover, charge-up occurs when the insulator is irradiated with the electron beam, it is necessary to shield an insulating portion or to adopt a complicated structure so that the electron beam does not reach.

Embodiments explained below relate to a charged particle beam device such as an electron microscope, optical devices that adjust and change a charged particle beam inside the charged particle device and a method of manufacturing these devices, which are characterized in that vanadium-containing glass is used as an insulator at the time of fixing, supporting and connecting metal electrodes or voltage applied members including vanadium glass or used by being applied to the members.

The vanadium-containing glass is an amorphous substance different from vanadium as a crystallization. The vanadium-containing glass is soften and flows in a low temperature and has high airtightness (no gas permeability), moreover, resistivity thereof can be controlled. Furthermore, a softening point can be controlled in a range of 300 to 700° C. by changing a composition ratio of contained materials, and the glass can be used as a bonding material for metal-to-metal and metal-to-insulator. As workability is good, processing accuracy equivalent to metal can be realized, and further, resistivity can be controlled within a range of $10^6$ to $10^{13}$ Ωcm.

Moreover, an ultra-high vacuum is required in a periphery of an electron source for stabilizing characteristics of the electron source and for extending lifetime. It has been known from knowledge that it is important to improve the degree of vacuum for stabilizing emission of electrons from the electron source. Though effects of a non-evaporable getter pump (NEG) and so on has been confirmed for improving the degree of vacuum, it has been difficult to achieve localized evacuation with a complicated structure of an electron gun.

The structure in the periphery of the electron source of the electron microscope is complicated, and a large-sized high vacuum pump is necessary for performing localized evacuation with a high degree of vacuum. However, there is no space for installing the large-sized high vacuum pump and the structure is complicated in the periphery of the electron source, therefore, it is difficult to set evacuation conductance to be high. Accordingly, even when the large-sized high vacuum pump is installed, there is resultingly a limit in practical evacuation ability. Then, in embodiment to be explained below, a charged particle beam device and a method of manufacturing a member for the charged particle beam device, an object of which is to realize improvement in performance of the charged particle beam device based on vanadium glass coating.

As an aspect for achieving the above object, a charged particle beam device is proposed, which includes a vacuum container an interior space of which is evacuated to form a high vacuum and coating layers formed on the surface of the vacuum container on the interior space side, in which the coating layers are vanadium-containing glass, namely, an amorphous substance.

A space where a high vacuum is desirable to be formed, for example, walls in a periphery of the electron source is coated with vanadium glass, thereby reducing a gas discharge in the periphery of the electron source and achieving localized evacuation by the getter effect of the coating layers, which enables achievement of the ultra-high vacuum without providing a large-sized high vacuum pump even in spaces having a complicated structure. Embodiments explained below relate to a charged particle beam device such as an electron microscope, a vacuum member capable of reducing the gas discharge and performing localized evacuation in the periphery of the electron source inside the charged particle beam device and a method of manufacturing the above, which is characterized in that vanadium-containing glass is used by being applied to members such as metal and insulators.

According to the above structure and method, it is possible to improve performance of the charged particle beam device based on improvement in functions of the charged particle beam device and members forming the charged particle beam device. A locally high vacuum can be realized without increasing a risk of electric discharge by using vanadium glass.

Moreover, vanadium-containing glass is used as a coating material for the metal and the insulator, thereby obtaining a structure in which the gas discharge can be reduced and a high vacuum can be maintained. Furthermore, the resistivity of vanadium glass is suitably controlled, thereby suppressing occurrence of charge-up and so on formed by collision of electrons and so on, which enables reduction of effects on a beam orbit due to the charge-up and reduction of possibility that dielectric breakdown and so on based on electric discharge occurs. In particular, even in a portion with a complicated structure where the evacuation conductance is low, a coated surface having the getter effect can be applied so as to face the vacuum space, therefore, it is possible to realize the high vacuum even in optical systems with a complicated inner structure.

The vanadium-containing glass is an amorphous substance different from vanadium as a crystallization, which is soften and flows in a low temperature and has high airtightness (no gas permeability), moreover, resistivity thereof can be controlled. Furthermore, the vanadium-containing glass is an amorphous uniform single material a main component of which (the highest ratio in contained components) is vanadium. The softening point can be controlled in a range of 200 to 700° C. by changing the composition ratio of contained materials, and the glass can be used as a coating material for metal and insulators. It is necessary that a thermal expansion coefficient of the glass corresponds to those of the metal and insulators when used as the coating material. In general, glass with a thermal expansion coefficient a ten percent or twenty percent smaller than a thermal expansion coefficient of a member to be coated is preferably used. The thermal expansion coefficient of the vanadium glass can be adjusted in a range of 4 to 20 ppm. Materials of members are stainless steel, titanium, aluminum, copper, gold, silver, nickel, cobalt, phosphor bronze, cast iron, soft magnetic materials (Permendur, Tough Bahn, iron and so on), kapton, ceramics (glass, alumina, zirconia, aluminum nitride, silicon carbide, silicon nitride, forsterite, steatite, cordierite, ferrite, mullite, sialon, barium titanate, lead zirconate tinanate, machinable ceramic and so on), thermoplastic resin, thermosetting resin and so on.

Figure 9:
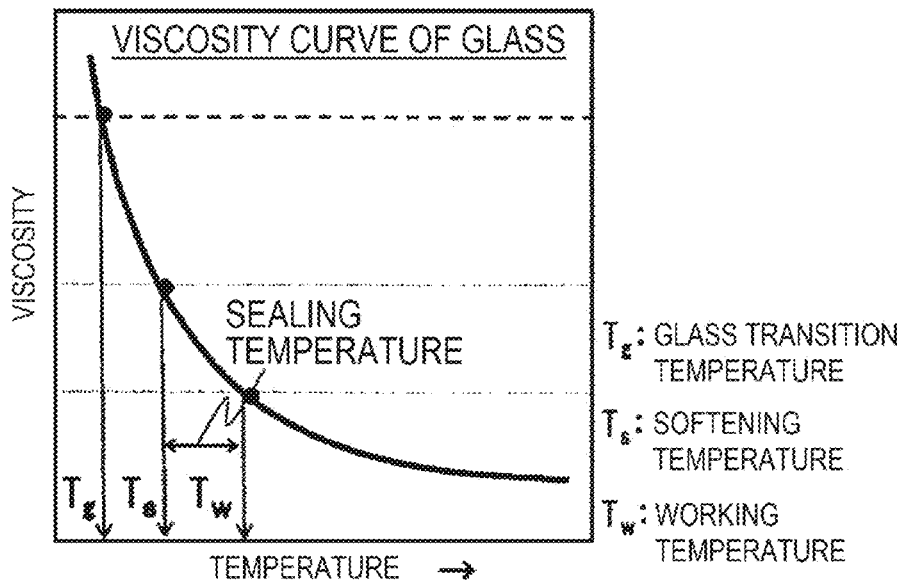
FIG. 9 is a graph indicating a relation between temperature and viscosity of glass.
Figure 10:
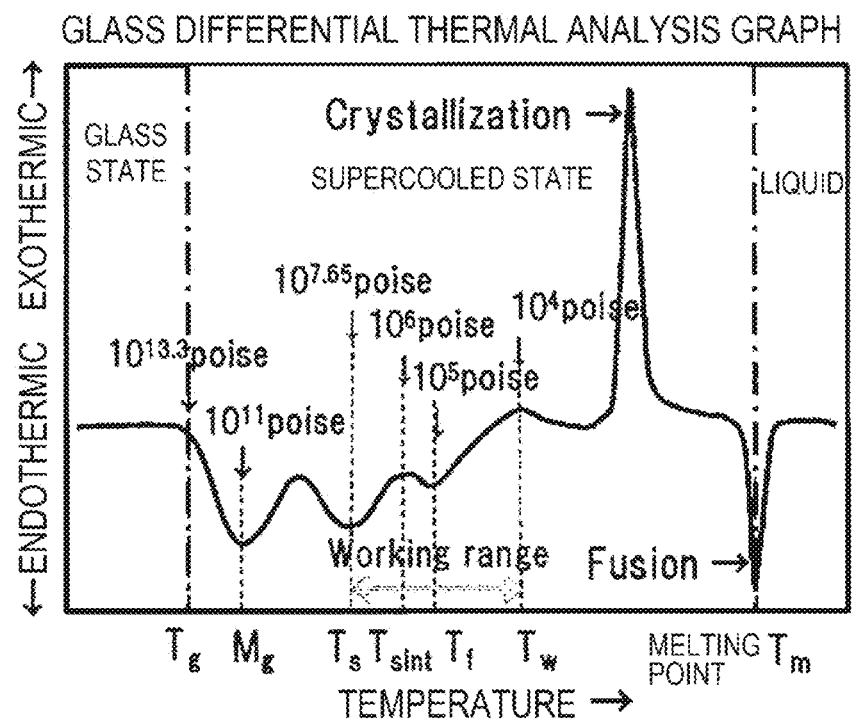
FIG. 10 is a graph of a differential thermal analysis of glass.

FIG. 9 shows a graph indicating variations in temperature and viscosity of glass. FIG. 10 shows a graph indicating differential thermal analysis of glass. In glass, as temperature is increased, the viscosity is reduced. A temperature at which glass is changed into supercooled liquid is a transition point (Tg), a point where expansion of glass is stopped is a yield point (Mg), a temperature at which glass starts to be softened is a softening point (Ts), a temperature at which glass becomes a sintered body is a sintering point (Tsint), a temperature at which glass starts to be melted is a pour point (Tf) and a temperature suitable for forming glass (temperature at which viscosity is 1E+4 dPas) is a working point. The transition point and the softening point are, for example, 535° C., 655° C. and the like. When vanadium-containing glass is heated from the softening point to the working point, the glass may be used as a bonding material, a coating material or a filler for filling minute concave portions and so on inside the vacuum container.

When vanadium-containing glass is used as the bonding material for metal-to-metal and metal-to-insulator, optical devices installed inside the charged particle beam device can be formed without performing fastening by screws, brazing and so on. Moreover, the glass has excellent workability, high positional accuracy can be obtained, as a result, optical devices and the charged particle beam device having high performance can be provided. Furthermore, the resistivity of vanadium glass is suitably controlled, thereby suppressing occurrence of charge-up and so on formed by collision of electrons and so on, which enables reduction of effects on the beam orbit due to the charge-up and reduction of possibility that dielectric breakdown and so on based on electric discharge occurs.

As an insulating material forming the vacuum container, vanadium-containing glass having excellent workability with a low softening point and capable of controlling a volume resistance value in an arbitrary range is used. The vanadium-containing glass can match the softening point and the thermal expansion coefficient to characteristics of a bonding member by changing the composition ratio of contained materials, therefore, the glass can function as a bonding material and can bond the metal and other insulators while maintaining high airtightness of the vanadium-containing glass itself.

Moreover, as the workability is excellent, a structure can be fabricated without performing assembling or welding of an electrode structure by forming an integral structure with a metal and performing cutting work to the structure.

Furthermore, the resistance value can be controlled, therefore, charge-up can be prevented even when electrons and so on are attached to the surface of the structure.

According to embodiments explained below, an electrode structure with high positional accuracy, which is capable of preventing charge-up can be creased. Moreover, a vacuum container with high airtightness can be created.

Hereinafter, a scanning electron microscope including vanadium-containing glass as a component and respective components will be explained in detail with reference to the drawings. In the following embodiments, explanation will be made by using the scanning electron microscope, however, the present embodiments may be applied to other charged particle beam devices.

As the vanadium glass can perform vacuum evacuation due to the getter effect, a high vacuum can be realized by using the glass not only as a structure forming respective parts of the electron microscope facing a vacuum space but also as a coating material for coating the structure.

FIG. 1 is a diagram showing an outline of a scanning electron microscope (charged particle beam device). A primary electron beam 107 emitted from an electron source 106 by an extraction voltage V1 applied between the electron source 106 and a first anode 102 proceeds to an electron microscope lens barrel 114 in a subsequent stage while being accelerated by a voltage Vacc applied between the electron source 106 and a second anode 104.

The extraction voltage V1 is controlled by an extraction voltage control circuit 151, and the acceleration voltage Vacc is controlled by an acceleration voltage control circuit 152.

The primary electron beam 107 is focused by a first focusing lens 113 controlled by a first focusing lens control circuit 153. In the primary electron beam 107, a sample irradiation current of the electron beam is controlled by an objective aperture 116. An electron beam central axis adjustment aligner 154 is provided for allowing the center of the electron beam to pass through an aperture center of the objective aperture 116, and an electron beam center adjustment deflector 115 for perform scanning with the electron beam on the objective aperture 116 is provided.

Furthermore, after a beam shape of the primary electron 107 is corrected by an aberration corrector 120, the beam is focused to be thin by an objective lens 119 and two-dimensionally scanning is performed on a sample 121 by an upper deflector 117 and a lower deflector 118. The sample 121 is arranged on a sample stage 122 that is XYZ-driven and controlled by a retarding voltage control mechanism 160.

Signal electrons 123 such as reflected electrons and secondary electrons are emitted from irradiation points of the primary electron beam 107 on the sample 121. The signal electrons 123 are detected by a detector 124, and an extended image of the sample 121 can be Obtained as an observation image by a signal processing mechanism 159 by a not-shown display method.

Embodiment 1

Figure 2:
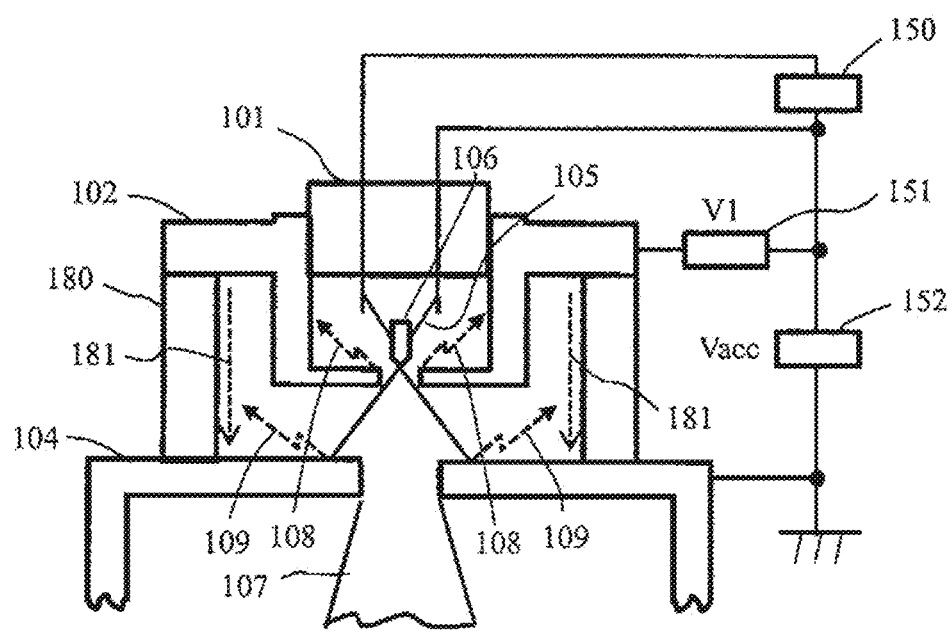
FIG. 2 is a diagram showing an example in which vanadium glass is applied to a connecting member for an anode of an electron source, a vacuum container for maintaining a vacuum atmosphere in the electron source.

In the device configuration explained above, an example will be explained in which vanadium-containing glass is applied to insulating portions of electrodes and a vacuum container. FIG. 2 is a schematic diagram of a structure in which the vanadium-containing glass is used for insulators in the periphery of an electron source and the vacuum container.

The acceleration voltage Vacc is applied between the first anode 102 and the second anode 104, which accelerates the primary electron beam 107 emitted from the electron source 106. The vanadium-containing glass is used as an insulator 180 that electrically insulates between the first anode 102 and the second anode 104.

A vacuum atmosphere is created in an area where the primary electron beam 107 passes, the outer side of which is surrounded by the air. The insulator 180 is used also as part of the vacuum container.

The size of the vanadium-containing glass used as the insulator 180 is determined in the following manner. The primary electron beam 107 collides with electrodes such as the first anode 102 and the second anode 104, and secondary electrons 108 and 109 which are so-called reflected electrons and scattered electrons are generated. The secondary electrons 108 and 109 are adhered to the insulator 180 and accumulated to be a cause of charge-up.

In order to prevent the charge-up, it is necessary to allow an irradiation dose of, for example, approximately several μA of the electron beam to flow on a wall surface of the insulator 180 on the vacuum atmosphere side. A voltage applied to the first anode and the second anode is Vacc—V1, and is normally—several kV to several ten kV.

A resistance value for satisfying the above is approximately $10^{11} \Omega$, and this resistance value can be realized when a shape with an outer diameter of 100 mm, an inner diameter 80 mm and a height 100 mm is fabricated by vanadium-containing glass with a resistivity of $10^9$ Ωcm. A common value of dielectric breakdown electric field strength of air is 3 kV/mm, and a distance enough to prevent electric discharge on the outer side can be secured. The size of vanadium-containing glass used as the insulator 180 is not particularly limited as long as the resistance value for preventing charge-up and the distance with no risk of electric discharge are secured.

The vanadium-containing glass has a low softening point, and can be directly bonded to the first anode 102 and the second anode 104. Bonding is performed by various bonding methods by heating including a method using a laser at the time of bonding.

The control of the resistance value is difficult in insulators other than the vanadium-containing glass, and it is necessary to take measures for preventing charge-up by making shapes of the first anode 102 and the second anode 104 in complicated structures or by inserting a shielding material before the insulator so that the secondary electrons 108 and 109 are not emitted. Additionally, the insulators are not capable of being directly bonded to metal, and it is necessary, in cases of ceramics, to perform silver soldering between Kovar and a ceramic that have close thermal expansion coefficients and to perform welding between Kovar and metal to fabricate the vacuum container. However, materials such as silver solder or Kovar may be factors of discharging an impure gas, therefore, the vacuum container capable of maintaining a high vacuum can be provided according to the embodiment not using the above structure. Furthermore, an insulator contacting the vacuum space with a large area is formed by the vanadium glass, thereby realizing the high vacuum due to the getter effect.

Embodiment 2

FIG. 3 are schematic views of a structure using vanadium-containing glass for an accelerating tube. In the accelerating tube, plural electrodes are stacked through insulators in the case of the electron microscope. The electron beam is accelerated in a multi-stage manner by voltages applied to respective electrodes. Such accelerating tube is used for a high-acceleration electron microscope such as mainly a transmission electron microscope, which accelerates the electron beam to, for example, several 100 keV.

In an accelerating tube not using vanadium-containing glass, insulators such as glass or ceramics are used. When the primary electron beam 107 or the secondary electrons 108 and 109 that are so-called reflected electrons and scattered electrons generated by the primary electron beam 107 collide, electrons are accumulated on the surface of the insulator, which causes charge-up. When charge-up occurs, potential distribution of the accelerating tube is changed and an orbit of the primary electron beam 107 is changed, then, a phenomenon where the beam fluctuates occurs at the time of observation. In order to prevent the charge-up phenomenon, it is necessary to form accelerating electrodes in a complicated structure in the accelerating tube not using the vanadium-containing glass so that the primary electron beam 107 and the secondary electrons 108 and 109 do not directly contact the insulator. Not only such accelerating electrodes complicate fabrication but also a potential gradient on the central axis is not strictly constant when the accelerating tube is assembled and an aberration of the primary electron beam 107 is increased. In order to make the potential gradient constant, resistors of several GΩ (bleeder resistors) are attached between respective electrodes, and the electron beam is accelerated while reducing effects of an electrostatic lens.

FIG. 3(a) shows an example where vanadium-containing glass is used in the first, third and fifth stages (glasses 201, 203 and 205) in FIG. 3(b) of an accelerating tube 207. Here, the vanadium-containing glass used for the accelerating tube has a characteristic of reducing the resistance particularly on an inner surface. A specific resistance value is in a range of $10^8$ to $10^{10} \Omega$. When the vanadium-containing glass is used, charges generated by collision of electrons on the inner surface flow on the surface as electric current, therefore, charge-up can be prevented. Accordingly, the shape of the accelerating electrodes in respective stages can be formed in a simple structure, which differs from an accelerating tube using insulators formed of a ceramic or the like.

Moreover, it is also possible to provide an accelerating tube not using the bleeder resistors by coordinating resistances of vanadium-containing glasses used for respective stages with the same values as bleeder resistors. Furthermore, a constant electric field can be obtained by changing the length or the resistance value of vanadium-containing glass in accordance with the distance between accelerating electrodes and the shape of the accelerating electrodes.

Additionally, the vanadium-containing glass has a low softening point and good workability. Accordingly, when the accelerating tube is fabricated, columnar vanadium-containing glasses 201, 203 and 205 and accelerating electrodes 202, 204 are stacked as shown in FIG. 3(b), and the vanadium-containing glasses are bonded. Subsequently, an integral structure 206 as shown in FIG. 3(c) is cut and processed, thereby completing a finishing shape. As assembling processes are omitted and works such as screwing and welding are not necessary according to the above, the accelerating tube having high positional accuracy such as concentricity can be formed. Therefore, orbital disorder of the primary electron beam 107 caused by an assembly error can be prevented and the aberration can be reduced. Furthermore, the number of parts is reduced, thereby reducing factors of discharging an impure gas and improving the degree of vacuum.

It is also possible to form an electrostatic lens in the same manner. More specifically, the electrostatic lens can be constructed by using the members 201, 203 and 205 as electrodes and using members 202 and 204 as insulating members formed of vanadium-containing glass.

Embodiment 3

FIG. 4 are schematic views of a structure in which vanadium-containing glass is used for the electrostatic lens. Electron lenses are used for converging the primary electron beam 107, and an electrostatic lens is used as one of the electronic lenses. The electrostatic lens has a structure in which electrodes with different potentials are coaxially stacked.

In the electrostatic lens including an insulator formed of ceramics and so on as a component, electrodes are electrically insulated from each other by the insulator. Accordingly, when the primary electron beam 107 or secondary electrons that are so-called reflected electrons and scattered electrons generated by the primary electrode beam 107 collide with the insulator, electrons are accumulated on the surface of the insulator and charge-up occurs. When charge-up occurs, potential distribution of the electrostatic lens is changed and an orbit of the primary electron beam 107 is changed, then, a phenomenon where the beam fluctuates occurs at the time of observation.

In order to prevent the charge-up phenomenon, it is necessary to form electrodes in a complicated structure so that the primary electron beam 107 or the secondary electrons do not directly contact the insulator. However, not only such electrodes complicate fabrication but also a desired electric field is not capable of being formed when the electrostatic lens is assembled, and an aberration of the primary electron beam 107 is also increased.

On the other hand, vanadium-containing glass has a low softening point and good workability. In the present embodiment, a tubular vanadium-containing glass 352 to be an insulating member and a columnar vanadium-containing glass 351 with a low resistance and to be a voltage applied member such as an electrode are prepared as shown in FIG. 4(b), which is formed into a shape as illustrated in FIG. 4(a) by performing cutting processing and the like to the member 351. As the vanadium glass can give a resistance value in a degree applicable as an alternative member of the electrode, an example in which both the insulating member and the voltage applied member are formed of vanadium-containing glass will be explained in the present embodiment.

FIG. 4(a) are views showing an electrostatic lens formed by using vanadium-containing glass. The electrostatic lens is configured by an insulating member 354 formed of a second vanadium-containing glass and voltage applied members 356, 358 and 360 formed of a first vanadium-containing glass. The insulating member 354 is provided with passages 355, 357 and 359 for threading a lead wire to which voltage is applied with respect to the voltage applied members 356, 358 and 360 respectively.

In the present embodiment, the columnar vanadium-containing glasses and electrodes are stacked and vanadium-containing glasses are bonded, then, an integral structure integrated by the bonding is cut and processes to complete a finishing shape for fabricating the electrostatic lens.

As assembling processes are omitted and works such as screwing and welding are not necessary according to the above, the electrostatic lens having high positional accuracy including concentricity can be formed. Therefore, orbital disorder of the primary electron beam 107 caused by an assembly error can be prevented and the aberration can be reduced. Furthermore, the number of parts is reduced, thereby reducing factors of discharging an impure gas and improving the degree of vacuum. The shape and the resistance value of the electrostatic lens are not always formed into the same shape and in the same resistance value, and an electric field shape can be controlled to obtain a desired lens effect by changing the length or the resistivity of vanadium-containing glasses in accordance with the distance between electrodes and the shape of the electrodes.

As another fabricating method, a cylindrical vanadium-containing glass and a columnar electrode are fitted to each other and the vanadium-containing glass is bonded. Subsequently, an integral structure 353 shown in FIG. 4(c) is machined to thereby complete a finishing shape. Wiring for giving potentials may be processed on a side surface, and it is also preferable that wiring is previously embedded in interfaces of divided cylindrical vanadium-containing glasses and that vanadium-containing glasses are bonded to one another.

Embodiment 4

FIG. 5 are schematic views of a structure in which vanadium-containing glass is used for an aberration corrector. Aberration correctors (multipole) using a magnetic field or an electric field is used for correcting an aberration of the primary electron beam 107, and an electrostatic aberration corrector is used as one of the aberration correctors. The electrostatic aberration corrector controls a beam shape of the primary electron beam 107 by adding a different potential to electrodes that are radially arranged.

The electrostatic aberration corrector using an insulator formed of a ceramic or the like electrically insulates electrodes by insulator formed of ceramics and the like. Accordingly, charge-up may occur by adhesion of the primary electrons beam 107 or secondary electrons such as reflected electrons or scattered electrons. When charge-up occurs, potential distribution between electrodes is changed and an orbit of the primary electron beam 107 is deviated from a desired orbit, then, a phenomenon where the beam fluctuates occurs at the time of observation. In order to prevent the charge-up phenomenon, it is necessary to form electrodes in a complicated structure so that the primary electron beam 107 or the secondary electrons do not directly contact the insulator.

The present embodiment relates to an aberration corrector that is easy to perform processing with a relatively simple structure. FIG. 5 show an octupole electrostatic aberration corrector using vanadium-containing glass for insulators of electrodes.

Vanadium-containing glass has a low softening point and good workability. Accordingly, first, a cylindrical vanadium-containing glass 402 and a columnar electrode 401 are fitted to each other as illustrated in FIG. 5(b), and both are bonded to each other for fabricating the electrostatic aberration corrector. Subsequently, an integral structure 403 illustrated in FIG. 5(b) is cut and processed to thereby complete a finishing shape. As assembling processes are omitted and works such as screwing and welding are not necessary according to the above, the electrostatic aberration corrector having high positional accuracy including concentricity can be formed. Therefore, orbital disorder of the primary electron beam 107 caused by an assembly error can be prevented and the aberration can be reduced. Furthermore, the number of parts is reduced, thereby reducing factors of discharging an impure gas and improving the degree of vacuum. Wiring for giving potentials may be processed on a side surface, and it is also preferable to use a corrector in which wiring is previously embedded in interfaces of a divided cylindrical vanadium-containing glasses and vanadium-containing glasses are bonded to one another.

An electrostatic deflector also has the same structure as the electrostatic aberration corrector, which can be fabricated in the same manner as the electrostatic aberration corrector.

An electrostatic aberration corrector as illustrated in FIG. 5(a) includes eight electrodes 404, 405, 406, 407, 408, 409, 410 and 411 and a tubular vanadium-containing glass that surrounds the electrodes. Moreover, in the tubular body, openings 412, 413, 414 and 415 for threading a lead wire are formed. It is also preferable that eight electrodes are formed as members containing vanadium glass having good conductivity. The device may be used not as an aberration corrector but as an electrostatic deflector.

Embodiment 5

Figure 6:
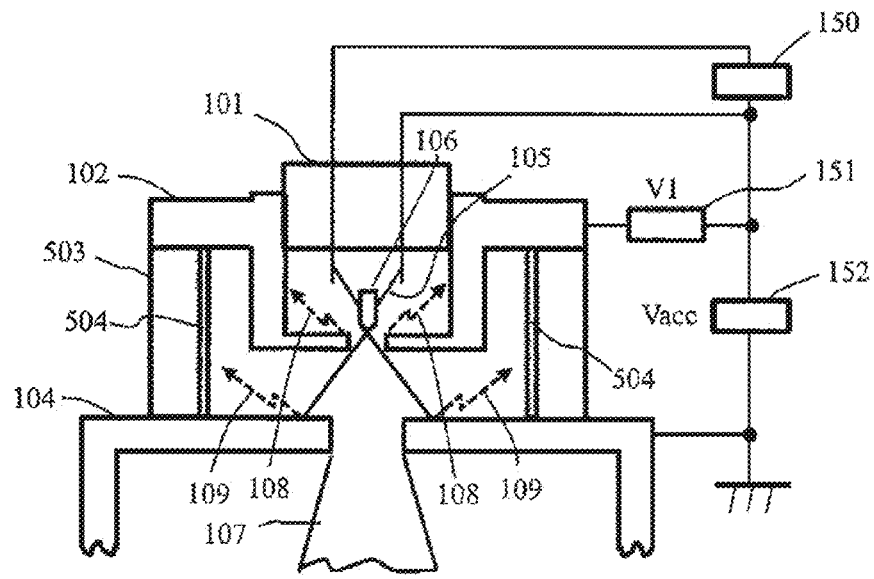
FIG. 6 is a diagram showing an example in which part of a structure around an electron source is formed of vanadium glass.

FIG. 6 is a schematic diagram of a structure in which vanadium-containing glass is formed on a surface of an insulator formed of ceramics and so on as an insulator in the periphery of the electron source. In a structure illustrated in FIG. 6, a vanadium-containing glass 504 is applied to an inner wall of an insulator 503. The vanadium-containing glass can be used by being applied as described above. It is thus possible to suppress charge-up by applying the vanadium-containing glass to an insulator surface with which electrons may collide.

The vanadium-containing glass can be applied with a thickness of several hundred μm and a surface resistance can be controlled to approximately $10^{11}\Omega$, therefore, charge-up can be prevented by allowing minute current to flow on the surface of the vanadium-containing glass when a high voltage is applied between electrodes.

On the other hand, the insulator 503 is formed by sintering. Therefore, when the structure illustrated in FIG. 6 is adopted, a relative position between the first anode 102 and the second anode 104 is shifted due to dimensional variation at the time of sintering, and it may be difficult to form the insulator with high accuracy as being designed. On the other hand, when the member 180 is formed of the vanadium-containing glass, or formed of a member containing vanadium glass as illustrated in FIG. 2, the member that supports the electrode is a member not deformed by dimensional variation at the time of sintering, therefore, an optical device for adjusting a beam with high processing accuracy can be formed.

Hereinafter, a method of forming a high vacuum by coating of vanadium-containing glass will be explained with reference to the drawings. Though the explanation will be made by using a vacuum container in the following embodiments, the present embodiment can be applied to other charged particle beam devices.

Figure 12:
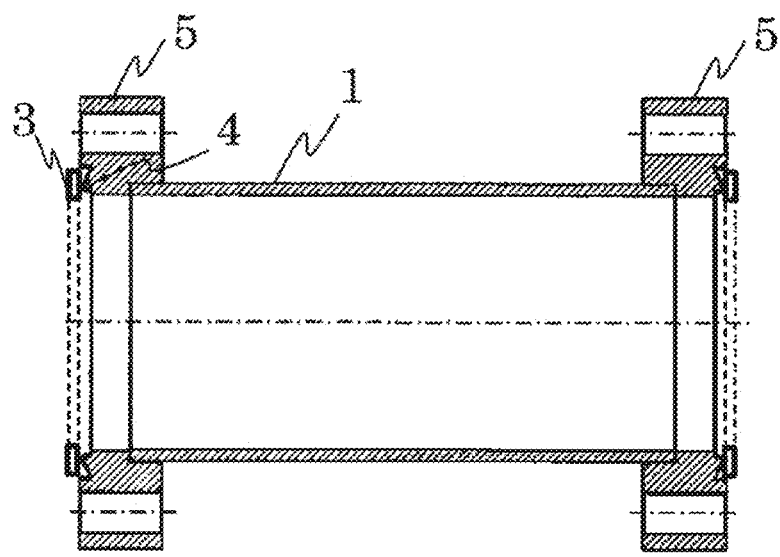
FIG. 12 is a cross-sectional view of a vacuum container formed of a stainless material.

FIG. 12 is a cross-sectional view of a single pipe using an ultra-high vacuum flange (ICF) complying with an international standard. A stainless material (mainly, SUS304L) 1 is used for the single pipe and a meter-sealing oxygen-free copper gasket 3 is used for connection between ultra-high vacuum flanges 5. Vacuum sealing is realized by allowing a knife edge 4 portion of the ultra-high vacuum flange 5 to bite into the copper gasket 3. In the charged particle beam device, the single pipe forms a wall surface of a vacuum changer to configure a charge particle beam column, therefore, the above-described copper gasket is used when plural vacuum changers (containers) are connected through flanges.

Figure 13:
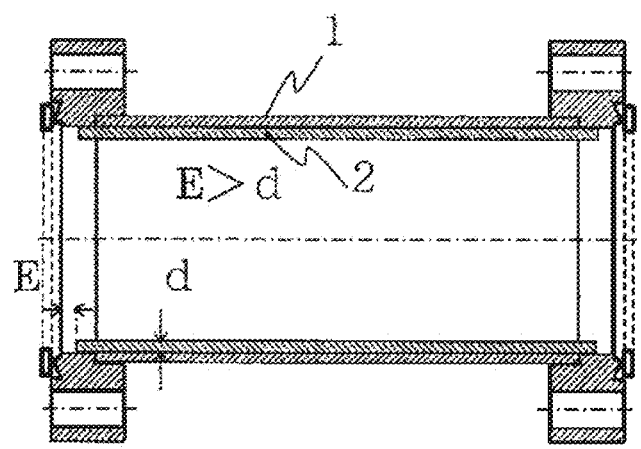
FIG. 13 is a cross-sectional view showing a state where an inner surface of a vacuum container formed of a stainless material is coated with vanadium glass.

FIG. 13 is a cross-sectional view showing a state after the vanadium-containing glass 2 is applied to the single pipe. Vanadium glass made to be in a paste state at 535° C. to 655° C. and is applied to an inner wall by methods such as spraying, brush coating and printing. After the application, the glass is dried at 150° C. for 30 minutes. A film thickness of the vanadium glass 2 after the drying is approximately 200 to 400 μm. The glass is placed in the air and baked at 330° C. for one hour and at 500° C. for one hour, thereby coating the inner wall of the single pipe with vanadium-containing glass. A film thickness of a coated layer is approximately the half of the film thickness after the application, which was approximately 100 to 200 μm. As crystallization occurs in the vanadium glass 2 when copper is diffused, it is necessary to prevent contact between the copper gasket 3 and the vanadium glass 2. In the embodiment, a relation between a thickness d[mm] of a wall after the vanadium glass is applied and a distance from an end surface of a coated film to the knife edge 4 portion of the ultra-high vacuum flange 5 or a distance E[mm] between the end of the coated film and the copper gasket 3 is set to E>d, which prevent the vanadium glass from contacting the copper gasket even when the vanadium glass 2 is melted and flows due to the baking performed after the application.

Figure 14:
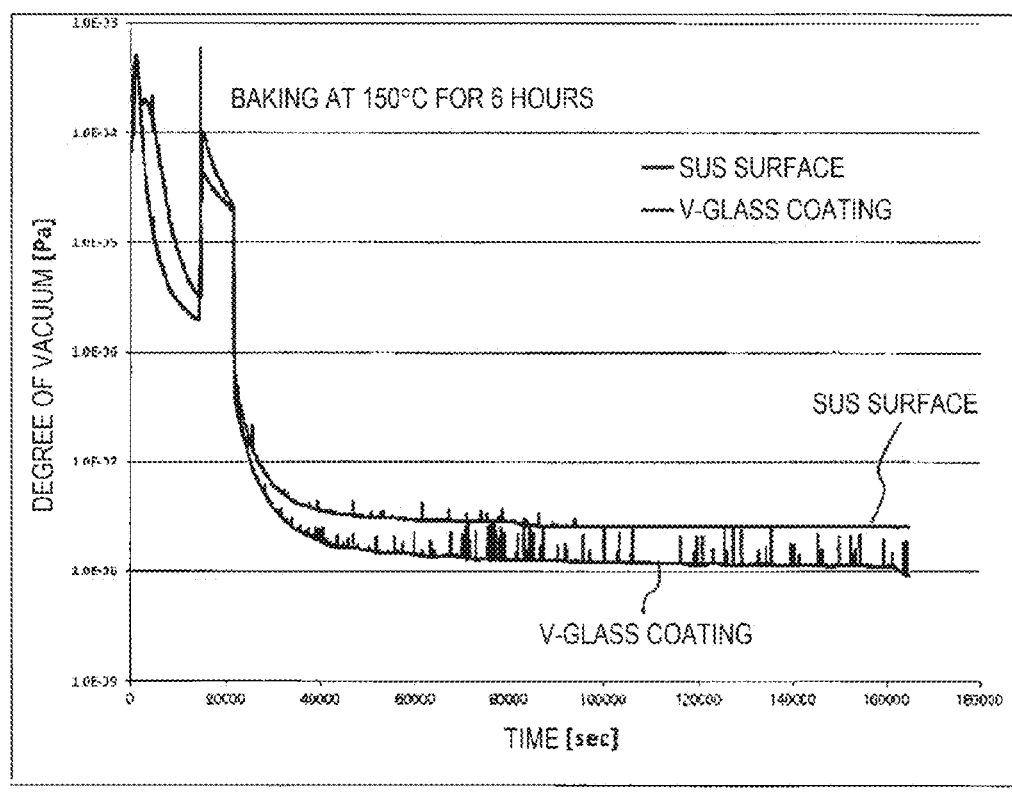
FIG. 14 is a view showing evacuation characteristics indicating differences in presence/absence of vanadium glass coating to a surface of a stainless material.

FIG. 14 shows evacuation characteristics indicating differences of attained degrees of vacuum, between a cross pipe provided with four ultra-high vacuum flanges ICF-114 and coated with vanadium glass (V-glass coating) as shown in FIG. 13 and a cross pipe provided with the same flanges and with a bare stainless surface (SUS surface) which are prepared and baked. Vacuum evacuation was performed by a turbomolecular pump of 240 L/s and a non-evaporation type getter pump. The degree of vacuum was measured by a nude ion gauge and a quadrupole mass spectrometer. A horizontal axis represents time [sec] and a vertical axis represents degree of vacuum [Pa] in FIG. 14. The baking was performed at 150° C. for six hours (21600 sec). After the baking is started, the degree of vacuum is increased with temperature increase of the cross pipe of the vacuum container both in the V-glass coated pipe and the SUS surface pipe, however, the gas discharge is gradually reduced. Here, in reducing conditions of gas discharge, discharge is reduced earlier in the V-glass coated pipe than in the SUS surface pipe as can be seen from results of FIG. 143. It can be found that adsorption of gas before baking is suppressed by coating the SUS surface with V-glass to thereby reduce the gas discharge. After four hours (14400 sec) passed in the baking, the degree of vacuum was increased once but gradually reduced both in the V-glass coated pipe and the SUS surface pipe due to degassing of the getter pump and the ion gauge.

It is found that the degree of vacuum is reduced earlier in the V-glass coated pipe as compared with the SUS surface pipe also after the end of baking (after 21600 sec). After 45 hours from the end of baking, the attained degree of vacuum was $9.3 \times 10^{-9}$ Pa or less in the V-glass coated pipe, whereas the attained degree of vacuum in the SUS surface was $1.6 \times 10^{-8}$ Pa. Though a baking temperature of 250° C. to 400° C. is necessary for achieving an ultra-high vacuum domain in the normal baking, it is found that attainment of an ultra-high vacuum domain in $10^{-9}$ Pa is achieved by V-glass coating even at a low-temperature baking of 150° C. That is, the characteristics indicate that localized evacuation can be performed in the ultra-high vacuum domain in which the degree of vacuum is $10^{-8}$ to $10^{-11}$ [Pa] due to the getter effect of the vanadium glass coating.

Embodiment 6

In the present embodiment, an example will be explained in which vanadium glass is applied to a member facing a vacuum space inside the electron source in the charged particle beam device. As explained with reference to FIG. 2., an electron gun of a scanning electron microscope is an optical device used for the electron microscope, which extracts electrons from the electron source 106 by the extraction voltage V1 applied between the electrode source 106 and the first anode 102 and accelerates the extracted electrons by the voltage Vacc applied between the electron source 106 and the second anode 104 to form the primary electron beam 107.

The example in which the member 180 is formed of vanadium glass has been explained with reference to FIG. 2, and an insulator made of a ceramic is normally used. When the secondary electrons 109 collide with the ceramic insulator, positive charge-up occurs. Moreover, when the primary electron beam 107 collides with the first anode 102 and the second anode 104, gas is discharged from the anode surfaces thereof, which deteriorates the degree of vacuum in the periphery of the electron source.

When the member in the vicinity of the electron source is positively charged, an unnecessary electric field is formed and an orbit of the electron beam is changed, which may be a cause of deteriorating stability of the electron gun.

Figure 15:
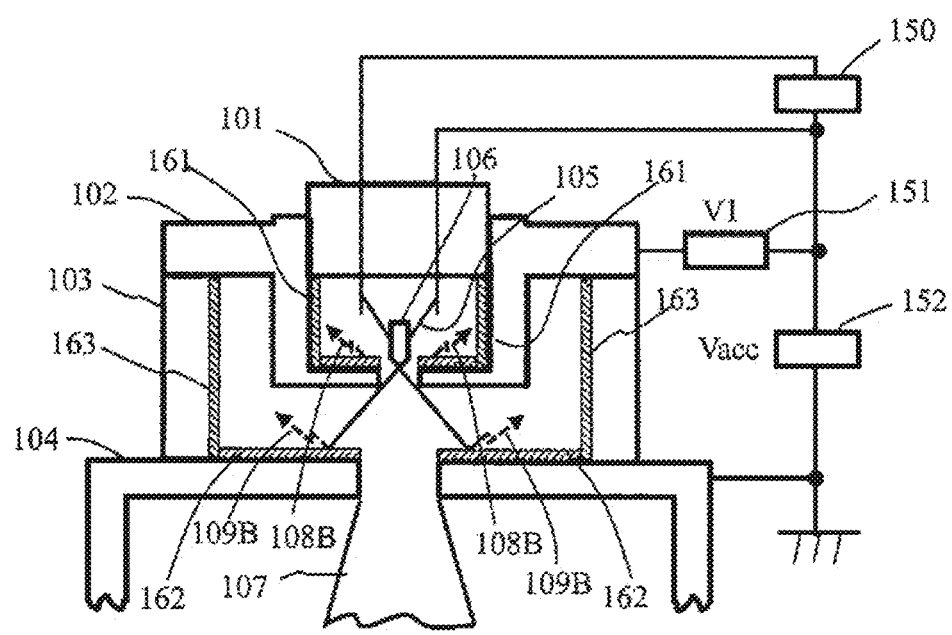
FIG. 15 is a diagram showing an example in which part of a structure around an electron source is coated with vanadium glass.

A structure of an electron source capable of suppressing charge-up and realizing a high vacuum even when the insulator is used will be explained below FIG. 15 is a diagram showing an example in which vanadium-containing glass is used for insulating portions of electrodes and the vacuum container in the domain where the degree of vacuum is in the range of $10^{-8}$ to $10^{-11}$ Pa.

In order to prevent charge-up of an insulator 103, first, generation of secondary electrons 108 and 109 that are so-called reflected electrons and scattered electrons should be suppressed. Vanadium glass coating is applied to inner walls (side walls of the electron source) of the first anode 102 and the second anode 104 with which electron beams are likely to collide. A vanadium glass coating 161 having a thermal expansion coefficient ten or twenty percent smaller than a thermal expansion coefficient of a material of the first anode 102 is applied to the inner wall of the first anode 102, and a vanadium glass coating 162 having a thermal expansion coefficient ten or twenty percent smaller than a thermal expansion coefficient of a material of the second anode 104 is applied. According to effects of these vanadium glass coatings 161 and 162, second electrons 108B and 109B that are so-called reflected electrons and scattered electrons generated when the primary electron beam 107 collides with the first anode 120 and the second anode 104 can be reduced as compared with a case where the vanadium glass coatings 161 and 162 are not applied. When the primary electron beam 107 collides with the first anode 102 and the second anode 104, gas discharged from the anode surfaces can be reduced and deterioration of the degree of vacuum in the periphery of the electron source can be also suppressed.

Furthermore, it is necessary to allow an irradiation dose of, for example, approximately several μA of the electron beam to flow on a wall surface of the insulator 103 on the vacuum atmosphere side for preventing charge-up of the insulator 103 due to the reduced secondary electron 108B and 109B. A voltage applied to the first anode and the second anode is Vacc—V1, and is normally—several kV to several ten kV. A resistance value for satisfying the above is approximately $10^{11} \Omega$ and can be realized by applying a vanadium glass coating 163 so as to obtain the resistance value.

Moreover, vanadium glass having the getter effect made to be in a paste state and is applied, thereby covering surfaces of even small parts. Therefore, sufficient evacuation effect can be expected even in a vacuum area with small evacuation conductance, as a result, a high vacuum inside the vacuum chamber can be realized. Additionally, the area of vanadium glass coating that contacts the vacuum space will be wider in a case where vanadium glass is applied to complicated components such as the interior of the electron source than in a case where vanadium glass is applied to a flat surface, therefore, a coating technique of vanadium glass is effective for realizing a high vacuum in an environment where minute parts exist.

Embodiment 7

Figure 16:
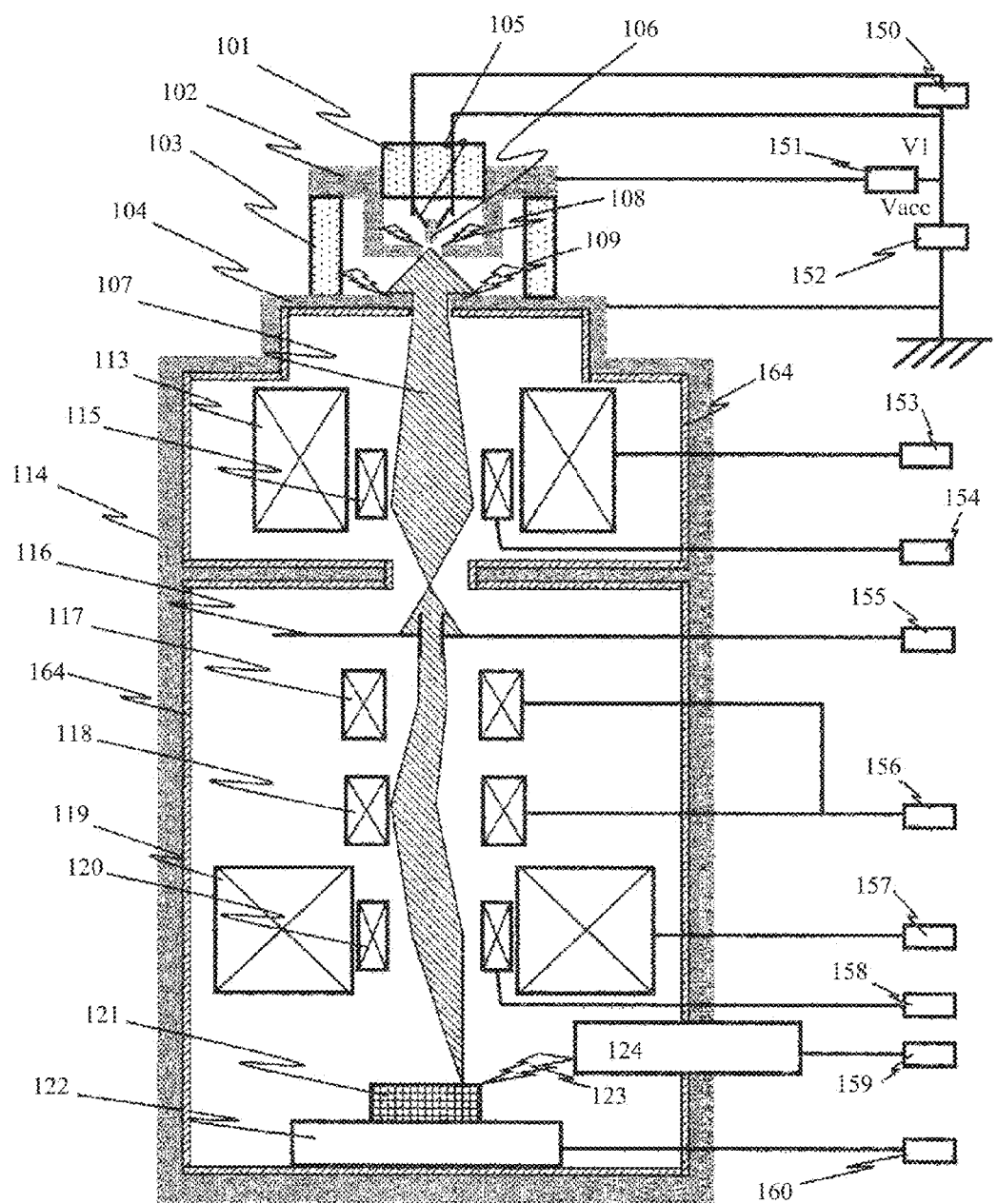
FIG. 16 is a diagram showing an outline of a scanning electron microscope (charged particle beam device) having a structure in which vanadium-containing glass is used.

FIG. 16 is a diagram showing an outline of a scanning electron microscope (charged particle beam device) having a structure in which vanadium-containing glass is used. An electron microscope lens barrel 114 is roughly divided into the following three vacuum container portions. That is, 1) a vacuum container in the periphery of an electron source, 2) a vacuum container including a first condenser lens 113 and the deflector 115, and 3) a vacuum container in which the objective aperture 116, the upper-stage deflector 117, the lower-stage deflector 118, the objective lens 119, the aberration corrector 120, sample stage 122, the detector 124 and so on are installed. In embodiment 6, an example in which vanadium glass coating is applied to a vacuum container in the periphery of the electron source is shown. The degree of vacuum is in the domain of $10^{-8}$ to $10^{-11}$ Pa. The degrees of vacuum in the vacuum containers of 2) and 3) are in a domain of $10^{-3}$ to $10^{-8}$ Pa, however, also in these vacuum containers, there are effects of reduction in the gas discharge and so on due to vanadium glass coating in the same manner as the vacuum container of 1). In the present embodiment, a vanadium glass coating 164 is applied to an inner wall of the electron microscope lens barrel 114, thereby obtaining effects of the reduction in the gas discharge, achievement of the high vacuum due to the getter effect and the like, reducing a baking temperature, reducing a baking time and reducing a downtime due to shortening of rising at the time of maintenance.

In the electron microscope lens barrel 114, optical devices (the first condenser lens 113, the deflector 115, the objective aperture 116, the upper-stage deflector 117, the lower-stage deflector 118, the objective lens 119, the aberration corrector 120 and so on) exist. These optical devices are formed of insulators and electrodes, and vanadium glass coating suitable to thermal expansion coefficients/insulation performances of respective materials is used for portions with which the primary electron beam 107 collides or portions with which the secondary electrons thereof collide in the same manner as in the periphery of the electron gun of 1), thereby reducing gas discharge and preventing charge-up.

Embodiment 8

Figure 7:
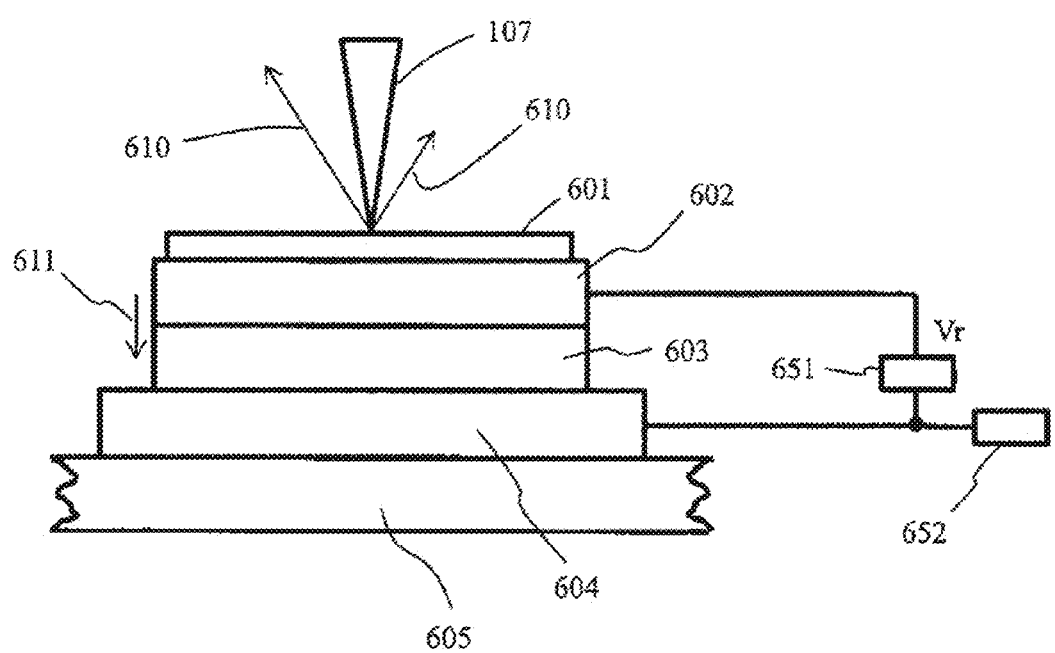
FIG. 7 is a diagram showing an example in which part of a structure of a sample stage for placing a sample is formed of vanadium glass.

FIG. 7 is a diagram showing an example in which vanadium-containing glass is used for an insulation structure of a sample stage. The sample stage illustrated in FIG. 7 is provided with a drive mechanism 604, which moves a sample 601 based on a drive signal supplied from a controller 652 so that a desired observation point on the sample 601 is irradiated with the primary electron beam 107. Recent sample stages have a structure in which a high voltage can be applied for decelerating the primary electron beam 107 incident on the sample 601. Accordingly, an insulator formed of a ceramic and so on is used for insulation between a vacuum container 605 in an earth potential and a sample holder (voltage applied member) 602 to which voltage is applied from a power supply for applying a decelerating electric field 651.

When the primary electron beam 107 or secondary electrons 610 generated therefrom collide with the sample 601 and the insulator, charge-up occurs in the sample 601 and the insulator. Accordingly, a vanadium-containing glass 603 is used as the insulator, and a minute current 611 is allowed to flow on the surface of the vanadium-containing glass 603, thereby preventing charge-up. Moreover, a stage structure will be complicated when using screwing or welding for fixing the insulator to the sample holder 602, however, the structure can be simplified by directly bonding the sample holder 602 to the vanadium-containing glass as the vanadium-containing glass has a low softening point.

The structure can be used for a side-entry stage for a minute sample used in a transmission electron microscope or the like and a material for fixing a movable aperture for controlling beam current, therefore, a simplified structure can be fabricated while preventing charge-up.

Embodiment 9

FIG. 8 are schematic diagrams of a structure in which plural vanadium-containing glasses with different resistance values are used for an electrostatic lens. A vanadium-containing glass with a resistivity of $10^6$ Ωcm generates an electric field when voltage is applied in the same manner as a metal electrode. The resistivity of insulators including ceramics is generally $10^{15}$ Ωcm, and a vanadium-containing glass with a resistivity of $10^{13}$ Ωcm close to the above can be used as an insulator. It is possible to fabricate an electrostatic lens by plural vanadium-containing glasses with different resistance values by the following method.

Figure 8A:
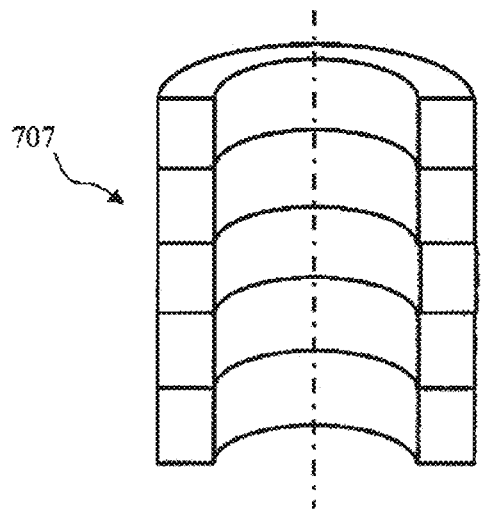
FIGS. 8A-8D are diagrams showing an example in which an electrostatic lens is configured by using plural vanadiums with different resistance values.
Figure 8B:
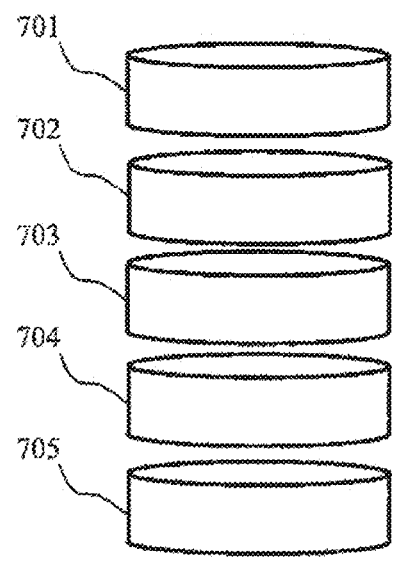
Figure 8C:
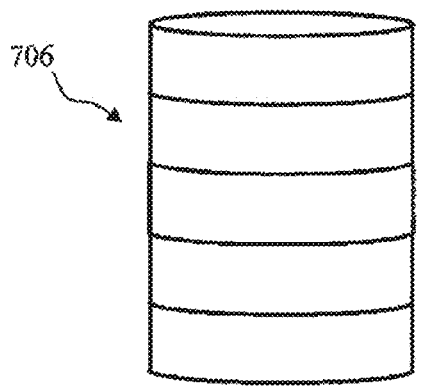

The vanadium-containing glass has a low softening point and good workability. Accordingly, when the electrostatic lens is fabricated, first, columnar vanadium-containing glasses and vanadium-containing glasses with different resistance values (701 to 705) are stacked and bonded to one another as shown in FIG. 8(b). Subsequently, an integral structure 706 as illustrated in FIG. 8(c) is cut and processed, thereby completing a finishing shape. As assembling processes are omitted and works such as screwing and welding are not necessary according to the above, the electrostatic lens having high positional accuracy including concentricity can be formed. Therefore, orbital disorder of the primary electron beam 107 caused by an assembly error can be prevented and the aberration can be reduced. Furthermore, the number of parts is reduced, thereby reducing factors of discharging an impure gas and improving the degree of vacuum. The shape and the resistance value of the electrostatic lens can be changed in accordance with the distance between electrodes and the shape of the electrodes, and are not particularly limited as long as a desired electric field can be generated and charge-up/electric discharge can be prevented.

Figure 8D:
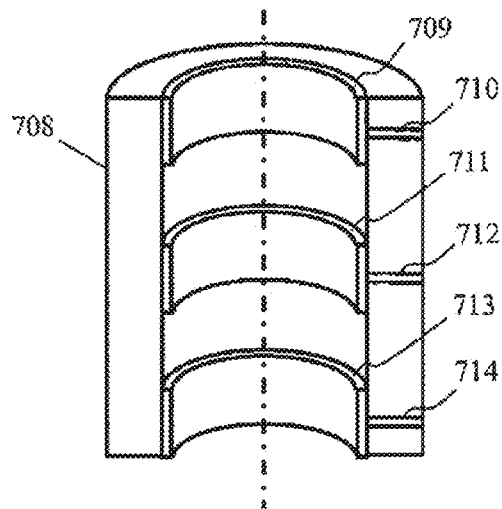

As another fabrication method, first, as shown in FIG. 8(d), vanadium-containing glasses (709, 711 and 713) with different resistance values (which can be voltage applied members with sufficiently low resistances) are applied to a surface of a cylindrical vanadium-containing glass 708, and the glass is processed to thereby configure an electrode. Concerning wiring for giving potentials to the voltage applied members, openings 710, 712 and 714 may be formed by processing a side surface as illustrated in FIG. 8(d). It is also preferable that wiring is previously embedded in interfaces of divided cylindrical vanadium-containing glasses and vanadium-containing glasses are bonded to one another.

Also in the accelerating tube, the electrostatic deflector and an electrostatic multipole, the electrode structure can be configured by using vanadium-containing glasses with different resistance values in the same manner, and the electrode structure capable of improving positional accuracy and preventing charge-up with simple structure can be provided.

Embodiment 10

Figure 11:
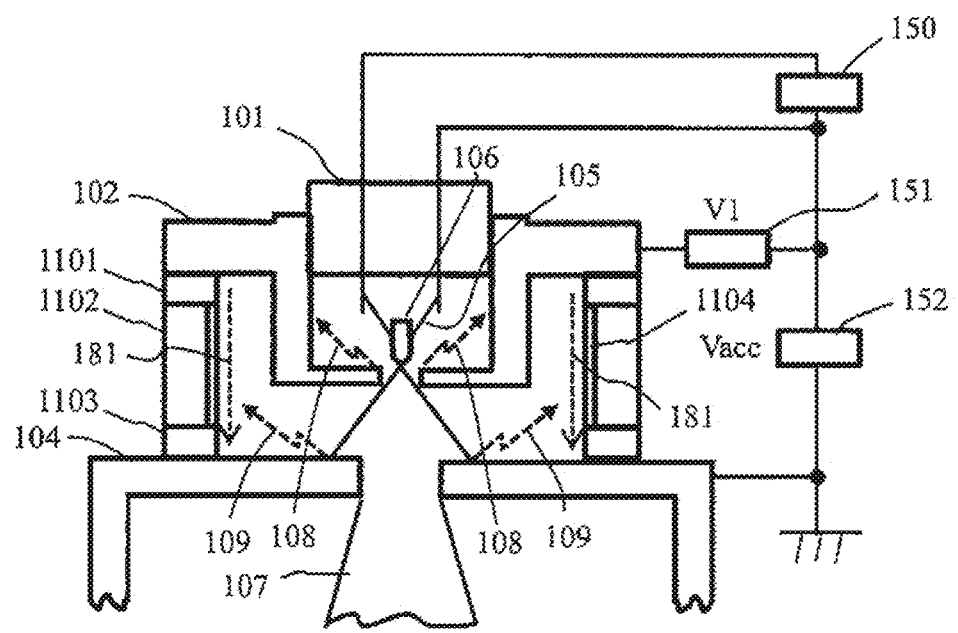
FIG. 11 is a diagram showing an example of an electron source including a connecting member formed of a member containing vanadium glass between a ceramic insulator and an electrode.

FIG. 11 is a diagram showing another example in which vanadium-containing glasses are adopted as support members for the electrode as the voltage applied members. In the present embodiment, for example, a ceramic insulator 1102 is used as a basic configuration material for an insulator for insulation, and connecting members 1101 and 1103 formed of vanadium-containing glass are interposed between the ceramic insulator 1102 and the first anode 102 and between the ceramic insulator 1102 and the second node 104 respectively. That is, a given distance is provided between the first anode 102 and the second anode 104, and the connecting member 1101, the ceramic insulator 1102 and the connecting member 1103 are provided as members for securing the distance for maintaining insulation. As described above, a ceramic is deformed at the time of baking and is difficult to secure high positional accuracy. On the other hand, vanadium-containing glass is easily cut and processed and also can connect between plural members by melting. Accordingly, a deformation amount of the ceramic can be absorbed by vanadium-containing glass, and an optical device having high positional accuracy can be formed by simple processing.

When vanadium-containing glass is applied as a member directly contacting the electrode and determining the position as described above, the optical device having high positional accuracy can be formed by the simple processing, as a result, a high-performance charged particle beam device can be provided. Furthermore, a thin film 1104 formed of vanadium-containing glass having a resistance value equivalent to those of the connecting members 1101 and 1103 is formed on a surface of the ceramic insulator 1102 on the surface of the vacuum chamber side for preventing electric discharge, thereby both securing high positional accuracy and suppressing charge-up.

REFERENCE SIGNS LIST 1 stainless material, 2 vanadium glass coating, 3 copper gasket, 4 knife edge, 5 vacuum flange, 101 feedthrough, 102 first anode, 103 insulator, 104 second anode, 105 heat generator, 106 electron source, 107 primary electron beam, 108 secondary electrons, 109 secondary electrons, 113 first focusing lens, 114 electron microscope lens barrel, 115 deflector, 116 objective aperture, 117 upper-stage deflector, 118 lower-stage deflector, 119 objective lens, 120 aberration corrector, 121 sample, 122 sample stage, 123 signal electrons, 124 detector, 150 heat generator current control circuit, 151 extraction voltage control circuit, 152 acceleration voltage control circuit, 153 first focusing lens control circuit, 154 electron beam central axis adjustment aligner, 155 objective aperture position control mechanism, 156 upper and lower stage deflector control circuit, 157 objective lens control circuit, 158 aberration corrector control circuit, 159 signal processing mechanism, 160 XYZ drive and retarding voltage control mechanism, 161 vanadium glass coating, 162 vanadium glass coating, 163 vanadium glass coating, 164 vanadium glass coating, 180 vanadium-containing glass, 181 surface current, 201 vanadium-containing glass (first stage), 202 electrode (second stage), 203 vanadium-containing glass (third stage), 204 electrode (fourth stage), 205 vanadium-containing glass (fifth stage), 206 integral structure of vanadium-containing glass and electrodes, 207 vanadium-containing glass and electrodes after processing, 301 electrode (first stage), 302 vanadium-containing glass (second stage), 303 electrode (third stage), 304 vanadium-containing glass (fourth stage), 305 electrode (fifth stage), 306 integral structure of vanadium-containing glass and electrodes, 307 vanadium-containing glass and electrodes after processing, 351 columnar electrode, 352 cylindrical vanadium-containing glass, 353 integral structure of vanadium-containing glass and electrodes, 354 vanadium-containing glass and electrodes after processing, 355 wiring for first stage electrode, 356 first stage electrode, 357 wiring for second stage electrode, 358 second stage electrode, 359 wiring for third stage electrode, 360 third stage electrode, 401 columnar electrode, 402 cylindrical vanadium-containing glass, 403 integral structure of vanadium-containing glass and electrodes, 404 electrode 1, 405 electrode 2, 406 electrode 3, 407 electrode 4, 408 electrode 5, 409 electrode 6, 410 electrode 7, 411 electrode 8, 412 wiring for electrode 3, 413 wiring for electrode 4, 414 wiring for electrode 5, 415 wiring for electrode 6, 503 insulator, 504 vanadium-containing glass, 601 sample, 602 sample holder, 603 vanadium-containing glass, 604 drive mechanism, 610 secondary electrons of reflected electrons and scattered electrons, 611 surface current.

The invention claimed is:

1. A charged particle beam device comprising:
   an optical device that adjusts a charged particle beam emitted from a charged particle source; and
   a vacuum container for forming a vacuum atmosphere in a path where the charged particle beam passes;
   a first anode for extracting charged particles from the charged particle source;
   a second anode for accelerating charged particles extracted by the first anode;
   an insulator arranged between the first anode and the second anode; and
   a vacuum pump that locally evacuates a peripheral portion of the charged particle source;
   wherein the insulator is formed of vanadium-containing glass.

2. The charged particle beam device according to claim 1, wherein the vanadium-containing glass contains vanadium as a main component.

3. The charged particle beam device according to claim 1, wherein the optical device is an electrostatic lens.

4. The charged particle beam device according to claim 1, further comprising:
an aberration corrector that corrects an aberration of the charged particle beam; and
a deflector that deflects the charged particle beam,
wherein at least one of the aberration corrector or the deflector is formed of vanadium-containing glass.

5. A charged particle beam device comprising:
an optical device that adjusts a charged particle beam emitted from a charged particle source; and
a vacuum container for forming a vacuum atmosphere in a path where the charged particle beam passes;
a first anode for extracting charged particles from the charged particle source;
a second anode for accelerating charged particles extracted by the first anode;
an insulator arranged between the first anode and the second anode; and
a vacuum pump that locally evacuates a peripheral portion of the charged particle source;
wherein at least one of the first anode, the second anode, and the insulator positioned inside the vacuum container is coated with a glass layer containing vanadium, at a surface on a charged particle source side.

6. The charged particle beam device according to claim 5, wherein the glass layer containing vanadium contains vanadium as a main component.

7. The charged particle beam device according to claim 5, wherein a degree of vacuum at a peripheral portion of the charged particle source is $10^{-8}$ to $10^{-11}$ [Pa].

8. The charged particle beam device according to claim 5, wherein the glass layer containing vanadium has a thermal expansion coefficients of 4 to 20 ppm.

9. The charged particle beam device according to claim 5, wherein the optical device is an electrostatic lens.

10. The charged particle beam device according to claim 5,
wherein the optical device is at least one of an aberration corrector that corrects an aberration of the charged particle beam and a deflector that deflects the charged particle beam.

11. The charged particle beam device according to claim 5,
wherein the glass layer containing vanadium is provided on an inner wall of a lens barrel of the charged particle beam device.

12. The charged particle beam device according to claim 5,
wherein the glass layer containing vanadium is provided in an optical device inside a lens barrel of the charged particle beam device.

13. A charged particle beam device comprising:
an optical device that adjusts a charged particle beam emitted from a charged particle source; and
a vacuum container for forming a vacuum atmosphere in a path where the charged particle beam passes,
wherein a member positioned inside the vacuum container is coated with a glass layer containing vanadium,
wherein the vacuum container includes a container that forms a vacuum chamber and a copper gasket for connecting the container to another member, and
an application range of the glass layer containing vanadium has a relation of E>d when a distance between the copper gasket and the glass layer containing vanadium is E and a film thickness of the glass layer containing vanadium is d.

14. A charged particle beam device comprising:
an optical device that adjusts a charged a particle beam emitted from a charged particle source:
a vacuum container for forming a vacuum atmosphere in a path where the charged particle beam passes;
a first anode for extracting charged particles from the charged particle source;
a second anode for accelerating charged particles extracted by the first anode; and
an insulator arranged between the first anode and the second anode,
wherein surfaces of the second anode and insulator on the charged particle source side located within the vacuum container are coated with the glass layer containing vanadium.

15. A method of manufacturing a member for a charged particle beam device including an optical device that adjusts a charged particle beam emitted from a charged particle source, and a vacuum container for forming a vacuum atmosphere in a path where the charged particle beam passes, the method comprising the step of:
coating a glass layer containing vanadium on a surface of a member for the charged particle beam device, which is a member placed on a vacuum space side of the charged particle beam device;
wherein the vacuum container includes a container that forms a vacuum chamber and a copper gasket for connecting to another member, and
an application range of the glass layer containing vanadium has a relation of E>d when a distance between the copper gasket and the glass layer containing vanadium is E and a film thickness of the glass layer containing vanadium is d.

16. The method of manufacturing the member for the charged particle beam device according to claim 15,
wherein the glass layer containing vanadium contains vanadium as a main component.

17. The method of manufacturing the member for the charged particle beam device according to claim 15,
wherein the glass layer containing vanadium is applied to a surface of the member by making vanadium-containing glass in a paste state or in a liquid state.

* * * * *